United States Patent
Ishibashi et al.

(10) Patent No.: US 8,754,445 B2
(45) Date of Patent: Jun. 17, 2014

(54) SEMICONDUCTOR DEVICE

(75) Inventors: Tadao Ishibashi, Yokohama (JP); Seigo Ando, Yokohama (JP); Yoshifumi Muramoto, Musashino (JP); Toshihide Yoshimatsu, Musashino (JP); Haruki Yokoyama, Musashino (JP)

(73) Assignees: NTT Electronics Corporation, Kanagawa (JP); Nippon Telegraph and Telephone Corporation, Chiyoda-Ku (JP)

( * ) Notice: Subject to any disclaimer, the term of this patent is extended or adjusted under 35 U.S.C. 154(b) by 0 days.

(21) Appl. No.: 13/981,050

(22) PCT Filed: Jan. 20, 2012

(86) PCT No.: PCT/JP2012/051178
§ 371 (c)(1),
(2), (4) Date: Jul. 22, 2013

(87) PCT Pub. No.: WO2012/102196
PCT Pub. Date: Aug. 2, 2012

(65) Prior Publication Data
US 2013/0313608 A1 Nov. 28, 2013

(30) Foreign Application Priority Data
Jan. 24, 2011 (JP) ................. 2011-012277

(51) Int. Cl.
*H01L 31/107* (2006.01)
(52) U.S. Cl.
USPC ............ 257/186; 257/12; 257/183; 257/184; 257/191; 257/E33.048
(58) Field of Classification Search
USPC ............ 257/12, 13, 20, 21, 24, 94, 183, 184, 257/186, 191, 192, 194, E33.048, E29.246, 257/E29.247, E29.248, E29.252
See application file for complete search history.

(56) References Cited

U.S. PATENT DOCUMENTS

| 6,927,412 B2 * | 8/2005 | Takahashi et al. ............... 257/13 |
| 2005/0121679 A1 * | 6/2005 | Nagahama et al. .............. 257/94 |

FOREIGN PATENT DOCUMENTS

| EP | 2378567 A1 | 10/2011 |
| JP | 60-242671 A | 12/1985 |

(Continued)

OTHER PUBLICATIONS

International Search Report dated Apr. 3, 2012 for corresponding International Patent Application No. PCT/JP2012/051178 with English translation (2 pages).

(Continued)

*Primary Examiner* — Eduardo A Rodela
(74) *Attorney, Agent, or Firm* — Ohlandt Greeley Ruggiero & Perle L.L.P.

(57) ABSTRACT

A layer in which the potential level difference normally unrequired for device operation is generated is positively inserted in a device structure. The potential level difference has such a function that even if a semiconductor having a small bandgap is exposed on a mesa side surface, a potential drop amount of the portion is suppressed, and a leakage current inconvenient for device operation can be reduced. This effect can be commonly obtained for a heterostructure bipolar transistor, a photodiode, an electroabsorption modulator, and so on. In the photodiode, since the leakage current is alleviated, the device size can be reduced, so that in addition to improvement of operating speed with a reduction in series resistance, it is advantageous that the device can be densely disposed in an array.

7 Claims, 9 Drawing Sheets

(56) References Cited

FOREIGN PATENT DOCUMENTS

| | | |
|---|---|---|
| JP | 05-243252 A | 9/1993 |
| JP | 07-254612 A | 10/1995 |
| JP | 2010-147177 A | 7/2010 |

OTHER PUBLICATIONS

International Preliminary Report on Patentability dated Aug. 8, 2013 corresponding to Japanese patent application No. PCT/JP2012/051178; 5 pages.

* cited by examiner

US 8,754,445 B2

SEMICONDUCTOR DEVICE

TECHNICAL FIELD

The present invention relates to a device structure of a semiconductor device.

BACKGROUND ART

A so-called compound semiconductor device manufactured by using a group III-V compound semiconductor is used as a heterostructure bipolar transistor (HBT) excellent in high-speed operation or various optical devices having a light-emitting function, a light-receiving function, and a light-modulating function and is a component essential to a current optical communication system and a wireless system. In such a compound semiconductor device, as the device is miniaturized to require higher-speed operation, the following problems due to the compound semiconductor easily occur.

In an integrated-circuit technology based on a Si-based material, it is possible to take advantage of a fabrication process technology having a degree of freedom, such as thermal diffusion of impurities, ion implantation, Si oxidation/insulation layer formation, poly-SI deposition, and selective growth. Meanwhile, the compound semiconductor device often has a device configuration based on a mesa structure. Thus, in the compound semiconductor device, there are large restrictions due to problems of the controllability of dimensions associated with mesa processing, the material characteristics, and surface characteristics. Especially, it is difficult to inactivate a surface of the compound semiconductor device (i.e. passivation). The reason why it is difficult to perform passivation is that a level is generated on a surface of the compound semiconductor. The level generated on the surface traps a carrier charge to toughen a control of a potential distribution in a device structure, and, thus, to generate an abnormal forward current associated with a current path of the surface, whereby there occurs a problem that the level becomes a recombination center and increases a dark current.

The problem of the surface characteristics of the compound semiconductor significantly affects when InGaAs with a high electron mobility most suitable for the high-speed operation is used in a base layer and a collector layer of HBT. Further, the problem of the surface characteristics of the compound semiconductor also affects InGaAs and an optical device using a multiple quantum well structure containing InGaAs according to the wavelength (1.5 micron band) used in long-distance optical communication. This is because the bandgap energy of InGaAs is so small as 0.75 eV, and, at the same time, passivation is difficult; therefore, a leakage current in the pn junction tends to increase. The problem of the surface characteristics of the compound semiconductor is common to a heterostructure bipolar transistor, a pin-type photodiode, and so on.

FIG. 6 is a cross-sectional view for explaining a structure of a conventional typical ultrafast HBT 50. In the HBT 50, the structure should be miniaturized to realize the high speed, and usually, a device is constituted by stacking mesa type pn junctions. The HBT 50 is of an npn type in which InGaAs is used in a p-type base layer 506 and an n-type collector layer 503.

In the HBT 50, an InP sub-collector layer 502 electrically separated in an island-shaped manner is disposed on a semi-insulating InP substrate 501, and a base-collector mesa constituted of a low concentration of n-type InGaAs collector layer 503 and a low concentration of p-type InGaAs base layer 506 is disposed on the InP sub-collector layer 502, and an n-type InP emitter layer 507 is disposed on the mesa. The HBT 50 is further provided with an emitter electrode 508, a base electrode 509, and a collector electrode 510. Usually, as in the HBT 50, the p-type base layer 506 and the n-type collector layer 503 are mesas having the same size, and a band diagram in an A-A' cross section of FIG. 6 is shown in FIG. 7. Thus, an electrical field remains as it is on a mesa side surface of a base-collector junction. In the base-collector junction constituted of InGaAs, passivation of a side surface of the mesa is difficult, and a leakage current in the junction tends to increase. When the forward current increases, the on-voltage of the collector increases, and thus there occurs a problem that operation in a low collector voltage region becomes difficult, and the reliability is impaired due to the instability thereof. When a backward leakage current is large, a portion of a base current flows to the collector side, and therefore, such a problem that a low current operation becomes difficult may occur.

As in a photodiode 60 of FIG. 8 to be described later, a layer equivalent to a non-doped InGaAsP surface cover layer 604 reducing the leakage current may be inserted under the p-type base layer 506. However, this structure increases the size of a collector mesa and may hamper the miniaturization of the device.

FIG. 8 is a cross-sectional view for explaining a structure of a photodiode for communication in which an ultrafast operation is required and, in particular, the photodiode 60 in which a speed of not less than 10 Gb/s is required. In the photodiode 60, a structure of a mesa-type semiconductor layer is often provided on a semi-insulating InP 601 for the purpose of reducing a junction capacity.

The photodiode 60 is constituted of a mesa-processed layer in which an n-type InP contact layer 602, a low concentration of InGaAs light-absorbing layer 603, a low concentration of InGaAsP surface cover layer 604, and a p-type InP contact layer 605 are provided in this order from the lower layer side, and the photodiode 60 further has a p-electrode 606 and an n-electrode 607 required for voltage application.

Unlike the HBT 50 of FIG. 6, in the photodiode 60, a relatively narrow p-type region (p-type InP contact layer 605) is formed in an island-shaped manner on a wide intermediate mesa including the InGaAs light-absorbing layer 603. An active region of a pn junction is a region defined by the p-type InP contact layer 605, and the junction capacity is reduced. FIG. 9(A) is a band diagram in an A-A' cross section of FIG. 8. As shown in the band diagram, the InGaAs light-absorbing layer 603 is depleted to induce the magnetic field suitable for diode operation.

An upper surface of the InGaAs light-absorbing layer 603 is covered with a non-doped InGaAsP surface cover layer 604 having a larger bandgap preventing exposure of InGaAs. In order to enlarge the upper surface of the InGaAs light-absorbing layer 603, the intermediate mesa is wider compared with a conventional photodiode. By virtue of such a structure, the electric field extending into the side surface of the intermediate mesa is reduced, and the photodiode 60 can suppress an occurrence of a leakage current attributable to a surface of InGaAs.

There has been proposed an inverted photodiode structure in which the polarity of the conductive type of the structure shown in FIG. 8 is switched, a p-type InP contact layer is disposed in the lower portion, and an n-type InP contact layer is disposed in the upper portion (for example, see Patent Document 1). The photodiode disclosed in the Patent Document 1 can suppress the occurrence of a leakage current by similar reasoning.

In the structure of the photodiode 60 of FIG. 8, an electro-absorption modulator having a ridge waveguide is one in which the InGaAs light-absorbing layer 603 is replaced with an optical core layer including InGaAs in an inner structure. As in the case of the photodiode 60, the electroabsorption modulator can suppress the occurrence of a leakage current attributable to an InGaAs surface.

PRIOR ART DOCUMENTS

Patent Documents

Patent Literature 1: Japanese Patent Laid-Open Publication No. 2010-147177

SUMMARY OF INVENTION

Problems to be Solved by the Invention

As described above, a pn junction of a semiconductor material having a small bandgap, such as InGaAs is used in various electronic devices and optical devices. However, in a device for the purpose of high-speed operation, even if the device has a structure similar to that of the photodiode of FIG. 8 or the above electroabsorption modulator, it is difficult to suppress the occurrence of a leakage current for the following reasons.

One of the reasons is a device size. When the photodiode is to be densely disposed in an array, the mesa size is limited. Namely, although the line of electric force extending into an InGaAs side surface is reduced by the lower mesa near the side surface of the intermediate mesa of FIG. 8 (B-B' cross section), a potential drop remains according to the size of the lower mesa (FIG. 9(B)). When the photodiode is to be densely disposed in an array, the size of the lower mesa is limited to make the photodiode close, and it is difficult to completely suppress the leakage current attributable to the InGaAs surface.

The other reason is a series resistance of the device. The series resistance is required to be reduced to realize the high-speed operation of the device. As shown in FIG. 8, in the structure in which the p-type InP contact layer 605 is disposed in the upper portion, and the n-type InP contact layer 602 is disposed in the lower portion, the size of the intermediate mesa less affects the series resistance. However, in the inverted photodiode disclosed in the Patent Document 1, the lower portion is a p-type InP contact layer. Since the hall mobility of the p-type InP contact layer is small, if the size of the p-type InP contact layer increases, the series resistance increases. When the series resistance is to be reduced to realize the high-speed operation, the size of the p-type InP contact layer should be reduced, and thus it is difficult to suppress the leakage current attributable to the InGaAs surface.

In the electroabsorption modulator aimed at high-speed operation, there are the following reasons. In the electroabsorption modulator, a ridge type optical waveguide is often configured, and a core layer region including InGaAs is disposed in the portion 603 of FIG. 8 under a ridge which is an upper clad (equivalent to 605 of FIG. 8). In this structure, the potential drop remains on the mesa side surface of the pn junction of a core, and the structure causes the occurrence of a leakage current and deterioration of the device.

As described above, in the device configuration aimed at high-speed operation, in terms of the size of the device and the series resistance, there is a problem that it is difficult to suppress the occurrence of a leakage current. Thus, in order to solve the problem, an object of the present invention is to provide a semiconductor device which can reduce a device size, reduce a series resistance, and suppress a leakage current.

Means for Solving the Problems

In order to achieve the above object, in the semiconductor device according to the present invention, an upper mesa smaller than an intermediate mesa is disposed on the intermediate mesa, and a non-doped semiconductor layer is disposed to cover an upper surface of the intermediate mesa. In this specification, a direction of stacking semiconductor layers is sometimes described as a vertical direction, and a direction parallel to a substrate surface is sometimes described as a horizontal direction. Layers close to a substrate are sometimes described as lower layers, and layers far from the substrate are sometimes described as upper layers.

More specifically, the semiconductor device according to the present invention has a laminate structure including a first semiconductor layer provided on one side of a substrate in parallel with the substrate surface, a p-type second semiconductor layer, an n-type third semiconductor layer, and at least one of an n-type fourth semiconductor layer and a p-type fifth semiconductor layer. In this semiconductor device, the first semiconductor layer is disposed between the second semiconductor layer and the third semiconductor layer, and the impurity concentration is lower than the impurity concentrations of the second and third semiconductor layers. The fourth semiconductor layer is disposed between the first semiconductor layer and the second semiconductor layer, and the bandgap is larger than that of the first semiconductor layer. The fifth semiconductor layer is disposed between the first semiconductor layer and the third semiconductor layer, and the bandgap is larger than that of the first semiconductor layer. When the second semiconductor layer is far from the substrate relative to the third semiconductor layer, the fourth semiconductor layer is essential, and the outer circumference of the second semiconductor layer is more inward than the outer circumference of the fourth semiconductor layer. When the third semiconductor layer is far from the substrate relative to the second semiconductor layer, the fifth semiconductor layer is essential, and the outer circumference of the third semiconductor layer is more inward than the outer circumference of the fifth semiconductor layer.

The non-doped fourth or fifth semiconductor layer is inserted to generate a potential difference in the fourth or fifth semiconductor layer. Since the generation of the potential difference prevents a voltage from being generated on the side surface of the intermediate mesa, a leakage current can be suppressed. Thus, the horizontal size of the device can be reduced, and the series resistance can also be reduced by the size reduction.

Accordingly, this invention can provide a semiconductor device which can reduce a device size, reduce the series resistance, and suppress the leakage current.

In the semiconductor device according to this invention, in a case where the second semiconductor layer is far from the substrate relative to the third semiconductor layer, when a reverse bias is applied to between the second semiconductor layer and the fourth semiconductor layer, a potential difference of not less than 0.2 V and not more than 1.0 V is generated in the fourth semiconductor layer. Further, in the semiconductor device according to this invention, in a case where the third semiconductor layer is far from the substrate relative to the second semiconductor layer, when a reverse bias is applied to between the third semiconductor layer and the fifth semiconductor layer, a potential difference of not less than 0.2 V and not more than 1.0 V is generated in the fifth semiconductor layer. When the generated potential difference is larger than the above range, a minimum bias voltage capable of maintaining the device operation increases. Meanwhile, when the generated potential difference is smaller than the above range, suppression of a leakage current becomes incomplete.

In the semiconductor device according to this invention, when the second semiconductor layer is far from the substrate relative to the third semiconductor layer, an n-type sixth semiconductor layer adjacent to the opposite side of the fourth semiconductor layer of the second semiconductor layer is further provided. The semiconductor device having this structure can be used as an NPN transistor.

In the semiconductor device according to this invention, when the third semiconductor layer is far from the substrate relative to the second semiconductor layer, a p-type seventh semiconductor layer adjacent to the opposite side of the fifth semiconductor layer of the third semiconductor layer is further provided. The semiconductor device having this structure can be used as a PNP transistor.

Advantageous Effects of the Invention

The present invention can provide a semiconductor device which can reduce a device size, reduce a series resistance, and suppress a leakage current.

BRIEF DESCRIPTION OF THE DRAWINGS

FIG. 1(A) is a cross-sectional view, and FIG. 1(B) is an upper view.

FIG. 2(A) is a band diagram of an active portion, and FIG. 2(B) is a band diagram of a peripheral portion.

FIG. 3(A) is a cross-sectional view, and FIG. 3(B) is an upper view.

FIG. 4(A) is a band diagram of an active portion, and FIG. 4(B) is a band diagram of a peripheral portion.

DESCRIPTION OF EMBODIMENTS

Figure 1:
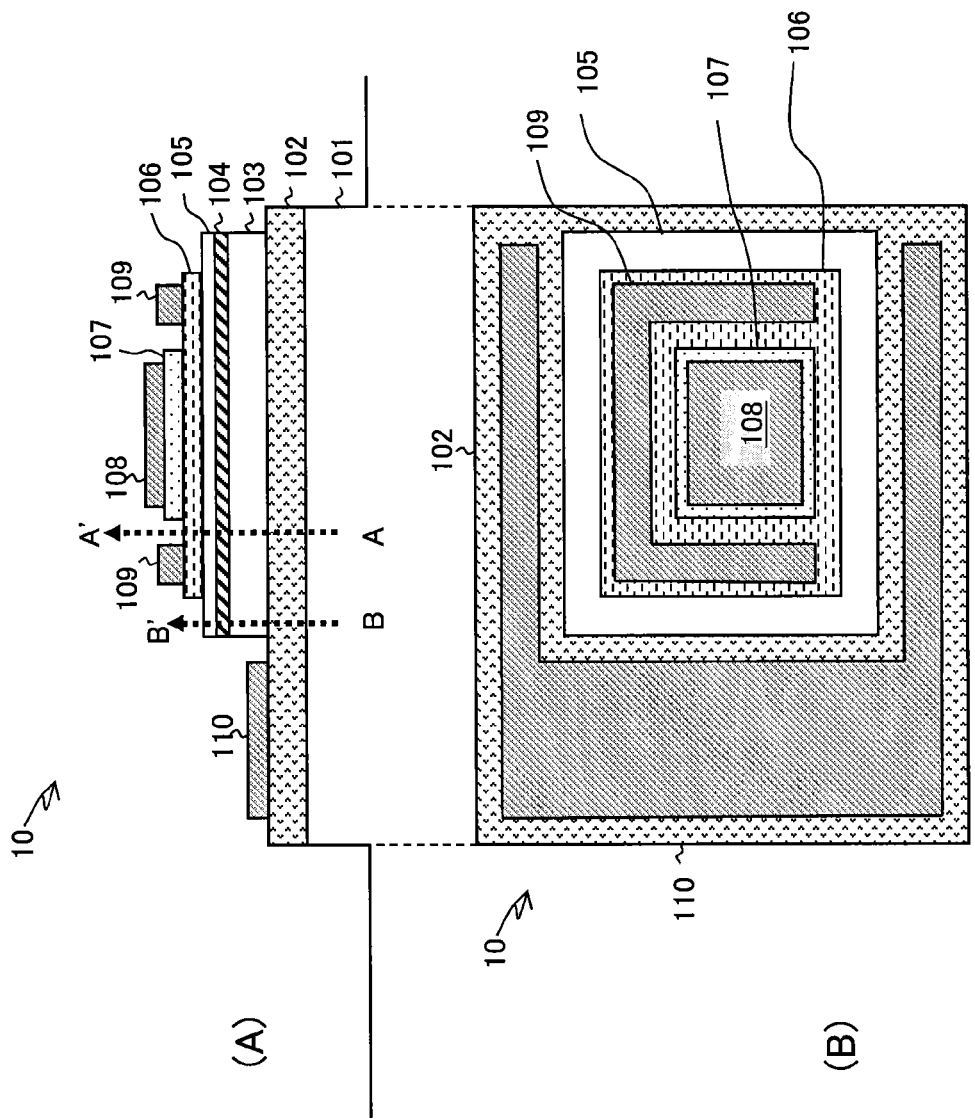
FIG. 1 is a view for explaining a semiconductor device according to the present invention.
Figure 2:
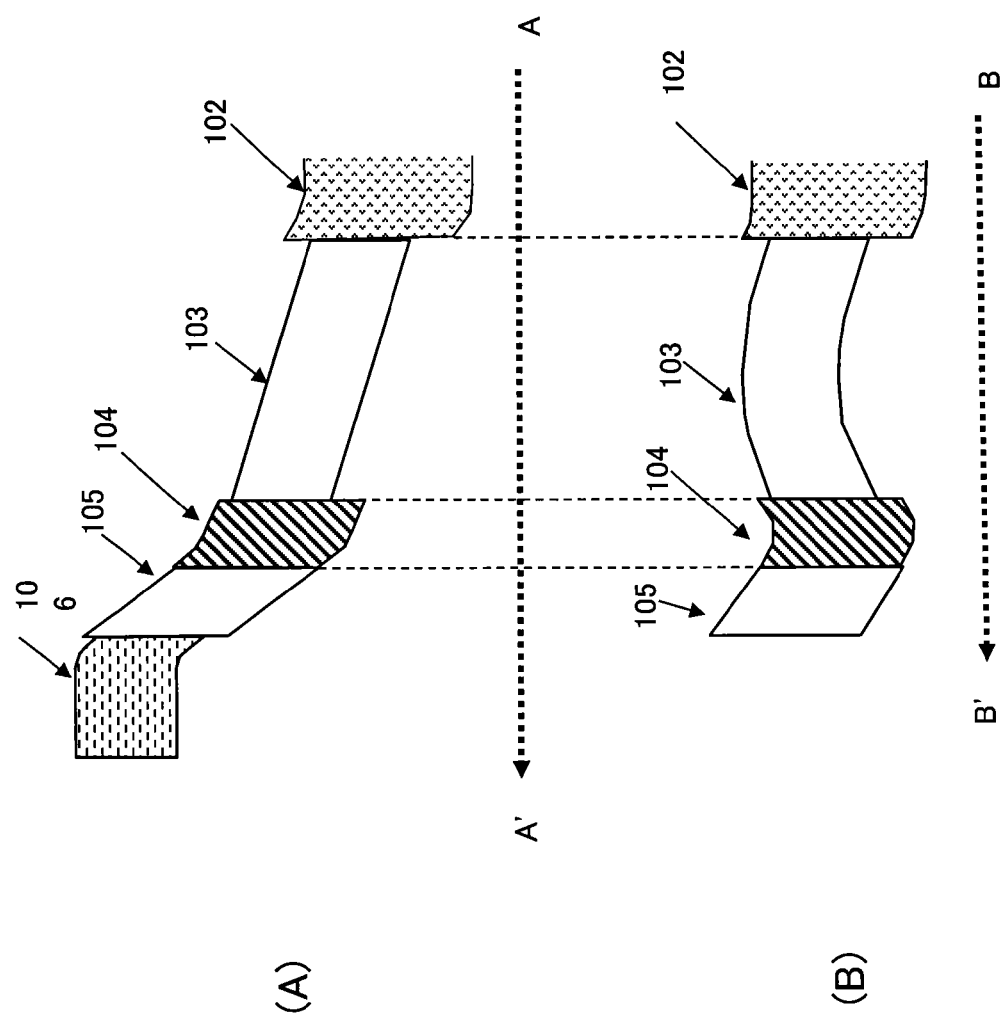
FIG. 2 is a view for explaining the semiconductor device according to the present invention.

Hereinafter, although the present invention will be described in detail using specific embodiments, the invention is not interpreted while limiting to the following description. Components denoted by the same reference numerals in the present specification and the drawings mutually denote the same components.

Embodiment 1

FIGS. 1(A) to 2(B) are views for explaining a semiconductor device 10 of the embodiment 1. The semiconductor device 10 is an npn-type heterostructure bipolar transistor (HBT). FIGS. 1(A) and 1(B) are views schematically showing a cross-sectional surface and an upper surface of the semiconductor device 10, respectively.

Reference numeral 101 is a semi-insulating InP substrate, reference numeral 102 is an n-type InP subcollector layer (described as an n-InP subcollector layer), reference numeral 103 is a low concentration of InGaAs collector layer, reference numeral 104 is an n-type InGaAsP electric-field control layer (described as n-InGaAsP electric-field control layer), reference numeral 105 is a low concentration of InGaAsP intermediate layer, reference numeral 106 is a high concentration of p-type InGaAs base layer (described as p$^+$-InGaAs base layer), reference numeral 107 is an n-type InP emitter layer (described as n-InP emitter layer), and reference numerals 108, 109, and 110 are an emitter electrode, a base electrode, and a collector electrode, respectively.

In the semiconductor device 10, the InGaAs collector layer 103 is a first semiconductor layer, the p$^+$-InGaAs base layer 106 is a second semiconductor layer, n-InP sub-collector layer 102 is a third semiconductor layer, the InGaAsP intermediate layer 105 is a fourth semiconductor layer, and the n-InP emitter layer 107 is a sixth semiconductor layer.

The low concentration in the InGaAs collector layer 103 and the InGaAsP intermediate layer 105 means "a state in which a donor or acceptor has a concentration low enough to cause little or no generation of an electric charge causing large electric field changes in the relevant layers when depletion occurs". Namely, the InGaAs collector layer 103 and the InGaAsP intermediate layer 105 each have a low donor or acceptor concentration compared to any other doping layers, and even if the layers are non-doped layers, the semiconductor device 10 can obtain the effect of the present invention. The high concentration in the p$^+$-InGaAs base layer 106 means that "the acceptor concentration is high enough to allow ohmic contact with the base electrode 109". For example, the impurity concentration of the p$^+$-InGaAs base layer 106 is preferably not less than $10^{19}/cm^3$.

First, a method of manufacturing the semiconductor device 10 will be described. In the manufacture of the semiconductor device 10, first, semiconductor layers 102 to 107 are epitaxially grown on a semi-insulating InP substrate 101 by an MO-VPE method. In the manufacture of the device, first, a mesa of the n-InP emitter layer 107, a mesa of the p$^+$-InGaAs base layer 106, the low-concentration of InGaAsP intermediate layer 105, the n-InGaAsP electric-field control layer 104, a collector mesa including the InGaAs collector layer 103, and a mesa of the n-InP sub-collector layer 102 are sequentially formed as four stages of mesas by a chemical etching method. When the p$^+$-InGaAs base layer 106 is processed, for the purpose of facilitating to stop etching at an interface between the p$^+$-InGaAs base layer 106 and the low concentration of InGaAsP intermediate layer 105 under the p$^+$-InGaAs base layer 106, the etching rate for the low concentration of InGaAsP intermediate layer 105 is namely reduced relatively lower than that for the p$^+$-InGaAs base layer 106. More specifically, the bandgap energy of the low concentration of InGaAsP intermediate layer 105 is not less than approximately 1 eV.

Finally, the emitter electrode 108, the base electrode 109, and the collector electrode 110 are formed. Although extraction electrodes, interlayer insulating layers, and pads thereof are not illustrated, these components are formed if necessary.

FIG. 1(B) is an upper view. A sub-collector mesa including the n-InP sub-collector layer 102, a collector mesa including the InGaAs collector layer 103 to the InGaAsP intermediate layer 105, a base mesa including the p$^+$-InGaAs base layer 106, and an emitter mesa including the n-InP emitter layer 107 are formed from the InP substrate 101 side. The mesa becomes smaller as it is provided on the upper side, the outer circumference of the collector mesa is provided inside the outer circumference of the sub-collector mesa, the outer circumference of the base mesa is provided inside the outer circumference of the collector mesa, and the outer circumference of the emitter mesa is provided inside the base mesa. Although each mesa has a rectangular shape, the shape is not limited to the rectangular shape.

When the emitter electrode 108, the base electrode 109, and the collector electrode 110 of the semiconductor device 10 are subjected to application of a suitable bias voltage (typically, a base of approximately +0.6 to 0.8 V and a collector of approximately +0.3 to 3 V for the emitter) to be in an operating state, the band diagrams of an active portion (A-A' cross section) and a peripheral portion (B-B' cross section) of the base-collector junction are shown in FIGS. 2(A) and 2(B), respectively.

In the manufacture of the semiconductor device, as shown in FIG. 2(A), a doping concentration of the n-InGaAsP electric field control layer 104 is regulated so that a portion ranging from the p$^+$-InGaAs base layer 106 to a portion of the n-InP sub-collector layer 102 are depleted. As described later, the thickness of the n-InGaAsP electric field control layer 104 is 20 to 40 nm, for example such that a potential level difference of an $n_2$-i-p portion is in a suitable range (0.2 V to 1.0 V), and the doping concentration of the n-InGaAsP electric field control layer 104 is regulated to 2 to $5\times10^{17}$/cm$^3$.

In the semiconductor device 10, a conductivity type is arranged in such an order that $n_1$ (n-type)-i(intrinsic)-$n_2$ (n-type)-i(intrinsic)-p(p-type) are stacked from the substrate side. It is important that the potential level difference of the $n_2$-i-p portion is in a suitable range (0.2 V to 1.0 V), and the potential level difference is usually preferably approximately 0.5 V to 0.8 V. If the potential level difference is too large, a minimum bias voltage (base-collector voltage in the HBT) capable of maintaining the device operation is increased. This voltage level difference is not necessary for the operation of HBT. The level difference does not significantly change the response characteristics.

Meanwhile, in the B-B' cross section of the peripheral portion, the n-InP sub-collector layer 102 to the low concentration of the InGaAsP intermediate layer 105 are connected so that $n_1$-i-$n_2$-i, and there is no p-type layer (FIG. 2(B)). In such a state that a reverse bias voltage is applied to the base-collector junction, even if the surface side of the n-InGaAsP electric field control layer 104 is rather depleted, electrons stay in the lower portion, and a neutral layer remains. In order to perform screening the entrance of the electric field into the lower portion, the potential drop of the low concentration of the InGaAs collector layer 103 does not occur. Namely, since a voltage is not applied to the mesa side surface of the collector mesa (side surface of the InGaAs collector layer 103), the occurrence of a leakage current in the forward direction and the opposite direction caused by the mesa side surface can be reduced.

Although the npn transistor structure has been described in the embodiment 1, the pnp transistor structure can be used by inverting the conductivity type.

Embodiment 2

Figure 3:
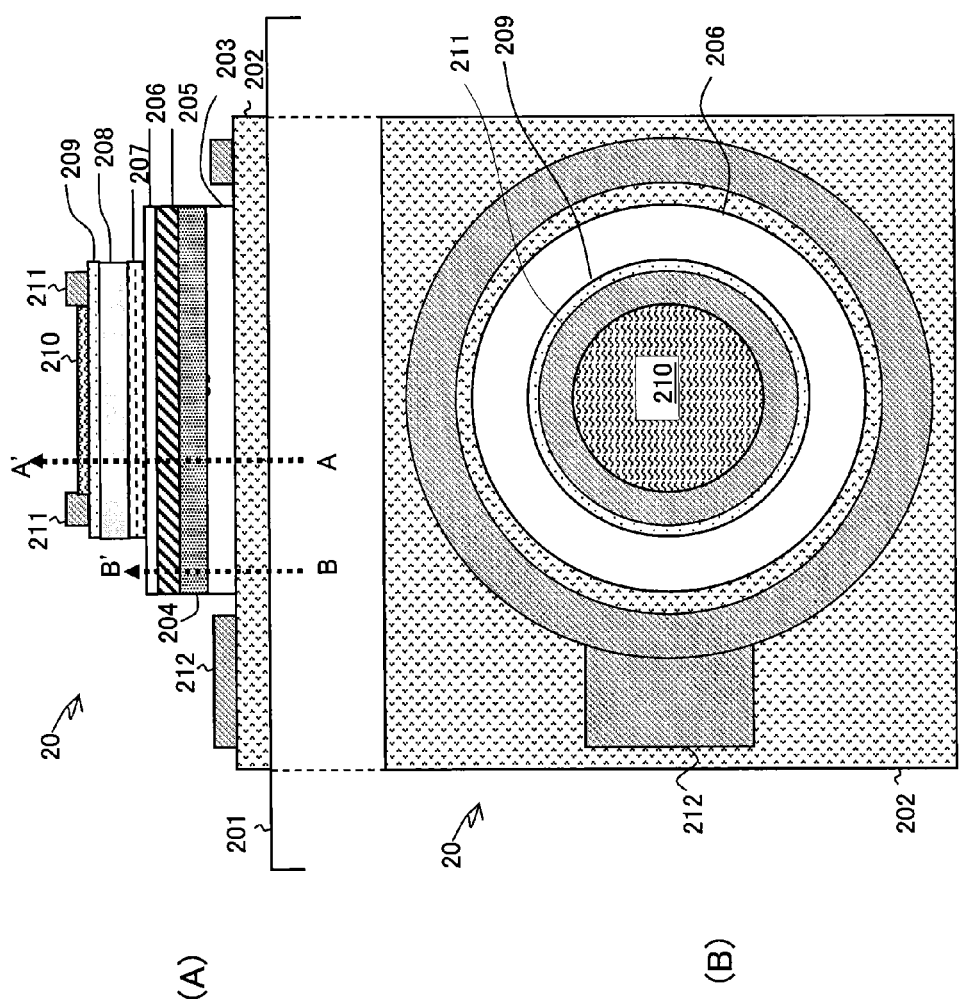
FIG. 3 is a view for explaining the semiconductor device according to the present invention.
Figure 4:
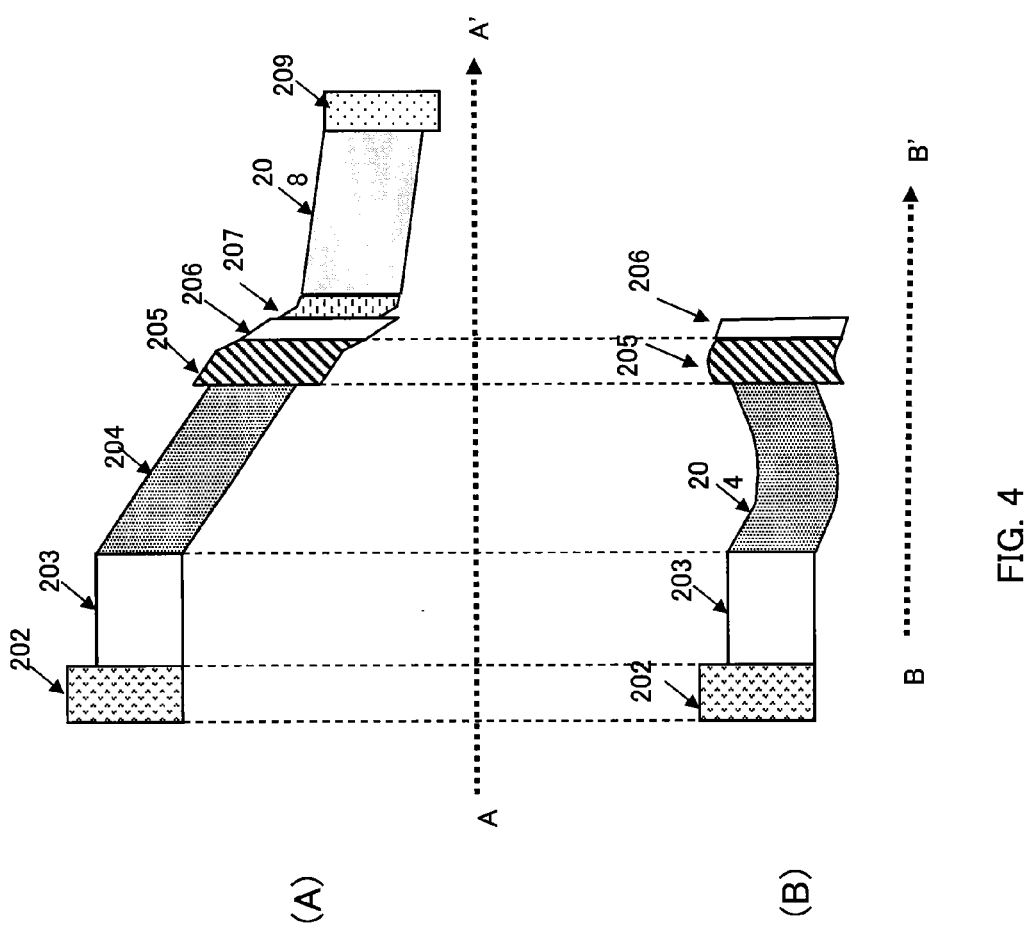
FIG. 4 is a view for explaining the semiconductor device according to the present invention.

FIGS. 3(A) to 4(B) are views for explaining a semiconductor device 20 of the embodiment 2. The semiconductor device 20 is a photodiode. FIGS. 3(A) and 3(B) are views schematically showing a cross-sectional surface and an upper surface of the semiconductor device 20, respectively.

Reference numeral 201 is a semi-insulating InP substrate, reference numeral 202 is a high concentration of p-type InGaAsP electrode layer (described as a p$^+$-InGaAsP electrode layer), reference numeral 203 is a p-type InGaAs light-absorbing layer (described as a p-InGaAs light-absorbing layer), reference numeral 204 is a low concentration of InGaAs light-absorbing layer (described as a ud.-InGaAs light-absorbing layer), reference numeral 205 is a p-type InGaAsP electric field control layer (described as an InGaAsP electric field control layer), reference numeral 206 is a non-doped InGaAsP intermediate layer (described as a ud.-InGaAsP intermediate layer), reference numeral 207 is an n-type InGaAsP electric field control layer (described as an n-InGaAsP electric field control layer), reference numeral 208 is a low concentration of InGaAsP electron transit layer (described as an n-InGaAsP electron transit layer), reference numeral 209 is a high concentration of n-type InGaAsP electrode layer (described as n$^+$-InGaAsP electrode layer), reference numeral 210 is a dielectric antireflection film, reference numeral 211 is an n-electrode, and reference numeral 212 is a p-electrode.

In the semiconductor device 20, the ud.-InGaAs light-absorbing layer 204 is a first semiconductor layer, the p-InGaAs light-absorbing layer 203 is a second semiconductor layer, the n-InGaAsP electron transit layer 207 is a third semiconductor layer, and the ud.-InGaAsP intermediate layer 206 is a fifth semiconductor layer.

The "low concentration" and "high concentration" have the same meanings as those in the embodiment 1.

First, a method of manufacturing the semiconductor device 20 will be described. In the manufacture of the semiconductor device 20, first, semiconductor layers 202 to 209 are epitaxially grown on a semi-insulating InP substrate 201 by the MO-VPE method. After that, an upper mesa constituted of the n$^+$-InGaAsP electrode layer 209, the n-InGaAsP electron transit layer 208, and the n-InGaAsP electric field control layer 207 is formed by chemical etching method. Preferably, the compositions of the n-InGaAsP electric field control layer 207 and the ud.-InGaAsP intermediate layer 206 are changed, and the etching rate for the upper layer is relatively increased, whereby etching is easily stopped near an interface between the both layers. After that, an intermediate mesa from the ud.-InGaAsP intermediate layer 206 to the p-InGaAs light-absorbing layer 203 is formed, and a lower mesa of the p$^+$-InGaAsP electrode layer 202 is formed in a similar manner and electrically separated. The upper mesa and the inside of the intermediate mesa under the upper mesa become an active portion (main region) of the device. After that, an n-electrode 211 and a p-electrode 212 are formed. Although extraction electrodes, interlayer insulating layers, and pads thereof are not illustrated, these components are formed if necessary. Finally, a dielectric antireflection film 210 is formed.

FIG. 3(B) is an upper view. A lower mesa including the p$^+$-InGaAsP electrode layer 202, an intermediate mesa including the p-InGaAs light-absorbing layer 203 to the ud.-InGaAsP intermediate layer 206, and an upper mesa including the n-InGaAsP electric field control layer 207 to the n$^+$-InGaAsP electrode layer 209 are formed from the InP substrate 201 side. The mesa becomes smaller as it is provided on the upper side, the outer circumference of the intermediate mesa is provided inside the outer circumference of the lower mesa, and the outer circumference of the upper mesa is provided on the outer circumference of the intermediate mesa. Although each mesa has a circular shape, the shape is not limited to the circular shape.

The operating condition of the semiconductor device 20 is less different from a usual pin-type photodiode. The band diagrams of an active portion (A-A' cross section) and a peripheral portion (B-B' cross section) at the time when a bias voltage is applied to the n-electrode 211 and the p-electrode 212 are shown in FIGS. 4(A) and 4(B), respectively. The active portion of FIG. 4(A) is depleted. For example, the bias voltage is in a range of 1.5 to 4 V.

In the manufacture of the semiconductor device, as shown in FIG. 4(A), a doping concentration of the p-InGaAsP electric field control layer 205 is regulated so that the layers ranging from the ud.-InGaAs light-absorbing layer 204 to the n-InGaAsP electron transit layer 208 are depleted. As described later, the thickness of the n-InGaAsP electric field control layer 205 is 20 to 40 nm such that a potential level difference of a p-i-n portion is in a suitable range (0.2 V to 1.0 V), and the doping concentration of the n-InGaAsP electric field control layer 205 is regulated to 2 to $5 \times 10^{17}/\text{cm}^3$.

In the semiconductor device 20, the arrangement of a conductivity type is p (p-type)-i (intrinsic)-n (n-type) including the p-InGaAsP electric field control layer 205, the ud.-InGaAsP intermediate layer 206, and the n-InGaAsP electric field control layer 207. It is important that the potential level difference at the p-i-n portion is in a suitable range (0.2 V to 1.0 V), and the potential level difference is usually preferably approximately 0.5 V to 0.8 V. If the potential level difference is too large, a minimum bias voltage capable of maintaining the device operation is increased. The potential level difference is not required for operation of a photodiode and does not exist in a conventional photodiode. In the semiconductor device 20, although the voltage level difference is provided in order to obtain the following effects, the potential level difference does not significantly change the response characteristics of the photodiode.

Meanwhile, the peripheral portion (B-B' cross section of FIG. 3(A)) of the intermediate mesa has a $p_1$-i-$p_2$-i structure from the p-InGaAs light-absorbing layer 203 side, and there is no n-type layer (FIG. 4(B)). In such a state that a reverse bias voltage is applied to a junction, even if the surface side of the p-InGaAsP electric field control layer 205 is rather depleted, as long as a hole remains in the lower portion and a neutral layer remains, in order to perform screening the entrance of the electric field into the lower portion, the potential drop of the ud.-InGaAs light-absorbing layer 204 does not occur. Namely, since a voltage is not applied to the mesa side surface of the intermediate mesa (side surface of the ud.-InGaAs light-absorbing layer 204), the occurrence of a leakage current in an opposite direction caused by the mesa side surface can be reduced.

The photodiode of the semiconductor device 20 is an inverted photodiode in which the p$^+$-InGaAsP electrode layer 202 is disposed in a lower mesa. In the prior art, in this type of photodiode structure, a series resistance attributable to a resistance in a horizontal direction is relatively high in the p$^+$-InGaAsP electrode layer 202, and this tends to affect high-speed operation. However, in the semiconductor device 20, since a voltage is not applied to the ud.-InGaAs light-absorbing layer 204 of the intermediate mesa side surface, the horizontal size of the intermediate mesa can be reduced without causing the increase of a backward leakage current, so that the series resistance can be reduced. The size reduction of the intermediate mesa contributes to the size reduction of the entire device, so that a distance between two or more photodiodes can be reduced to bring the photodiodes close to each other, and the semiconductor device 20 can be densely disposed in an array.

Embodiment 3

Figure 5:
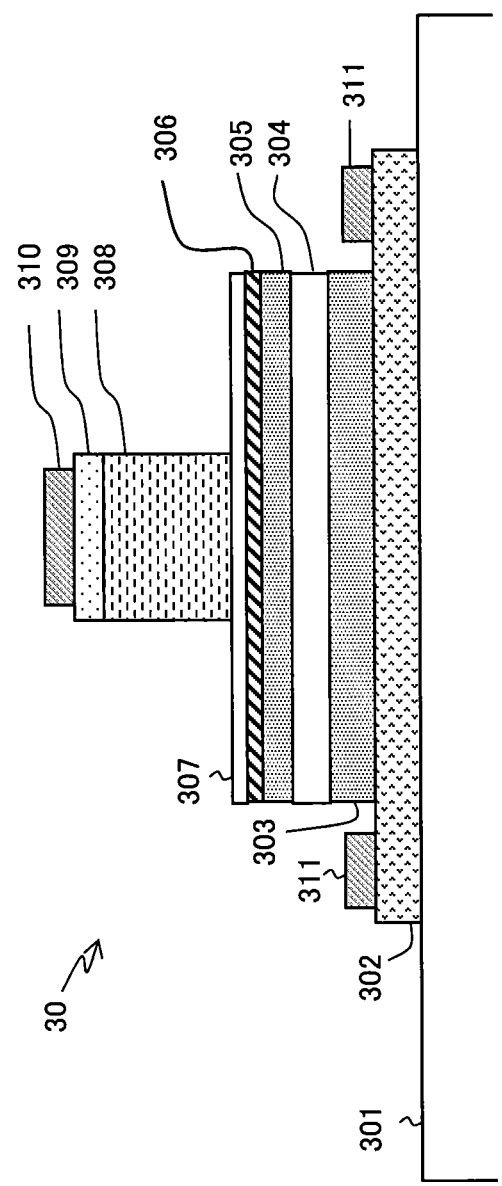
FIG. 5 is a cross-sectional view for explaining the semiconductor device according to the present invention.
Figure 6:
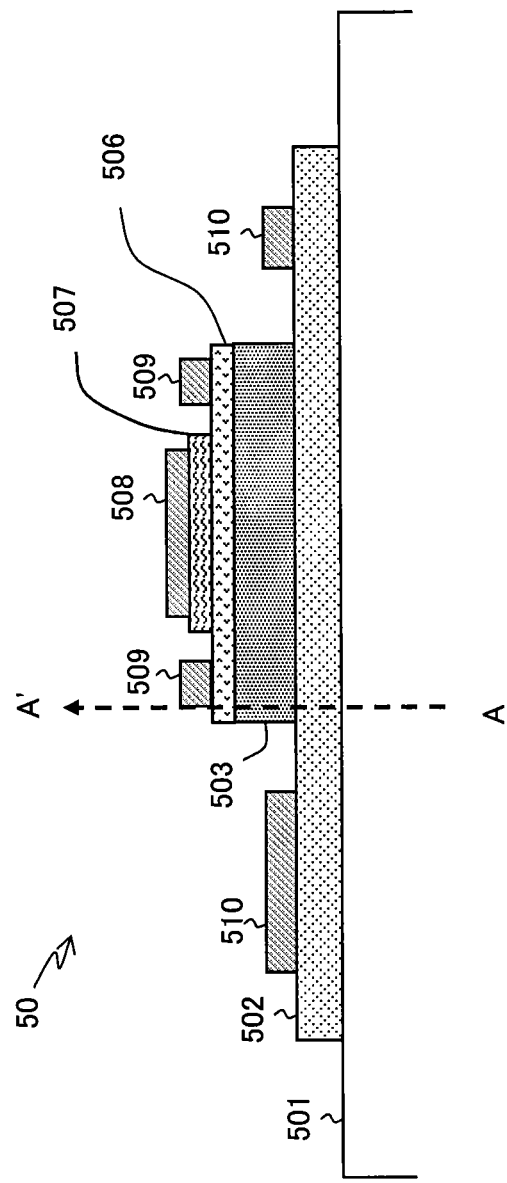
FIG. 6 is a cross-sectional view for explaining a conventional HTB.
Figure 7:
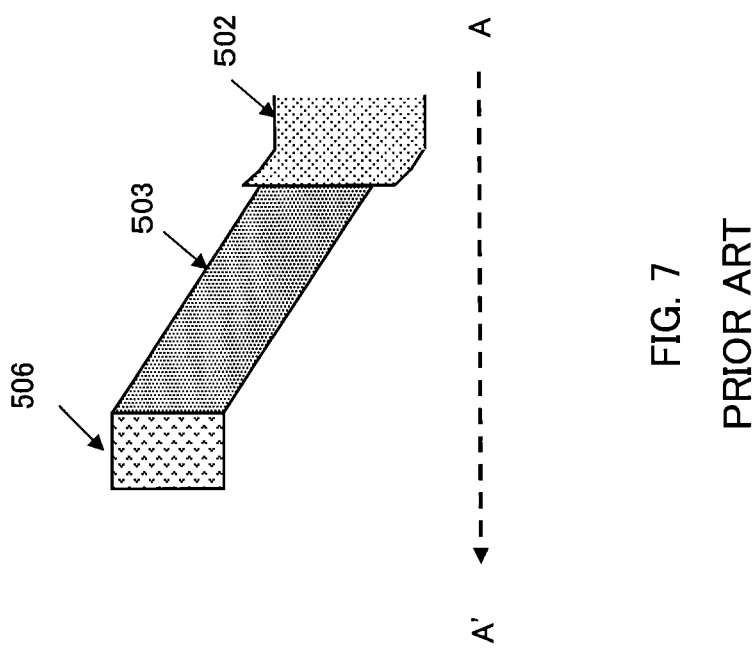
FIG. 7 is a band diagram in an A-A' cross section of FIG. 6.
Figure 8:
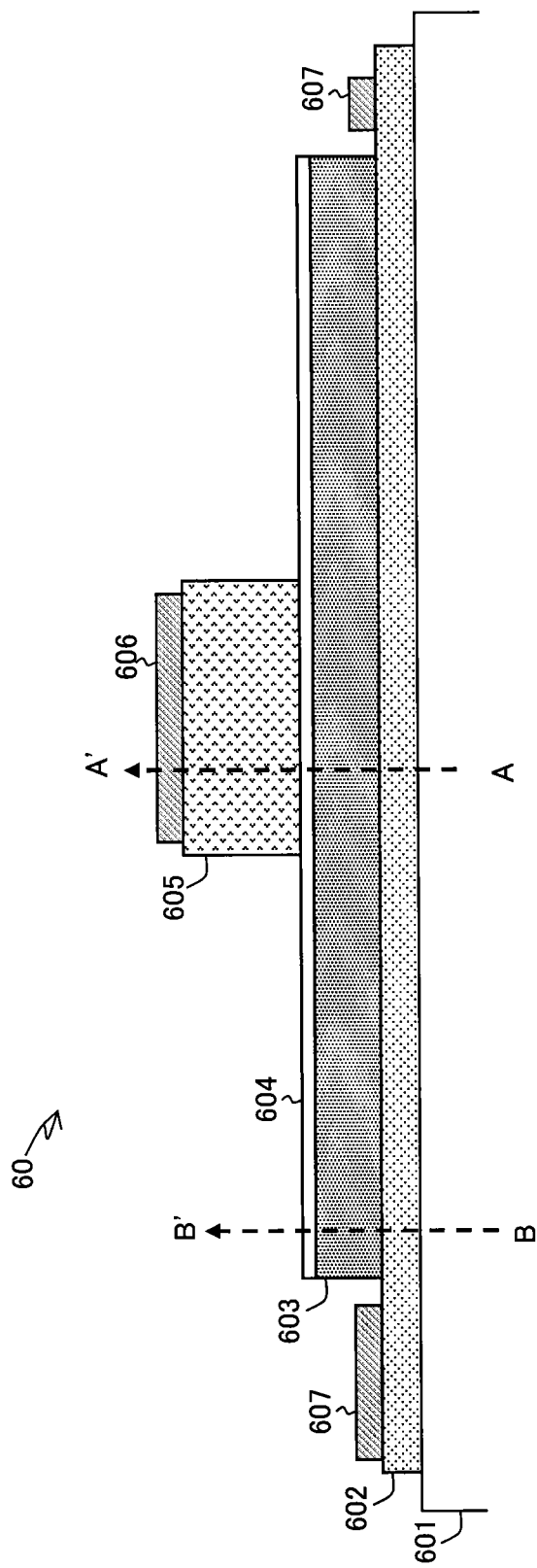
FIG. 8 is a cross-sectional view for explaining a conventional photodiode.
Figure 9:
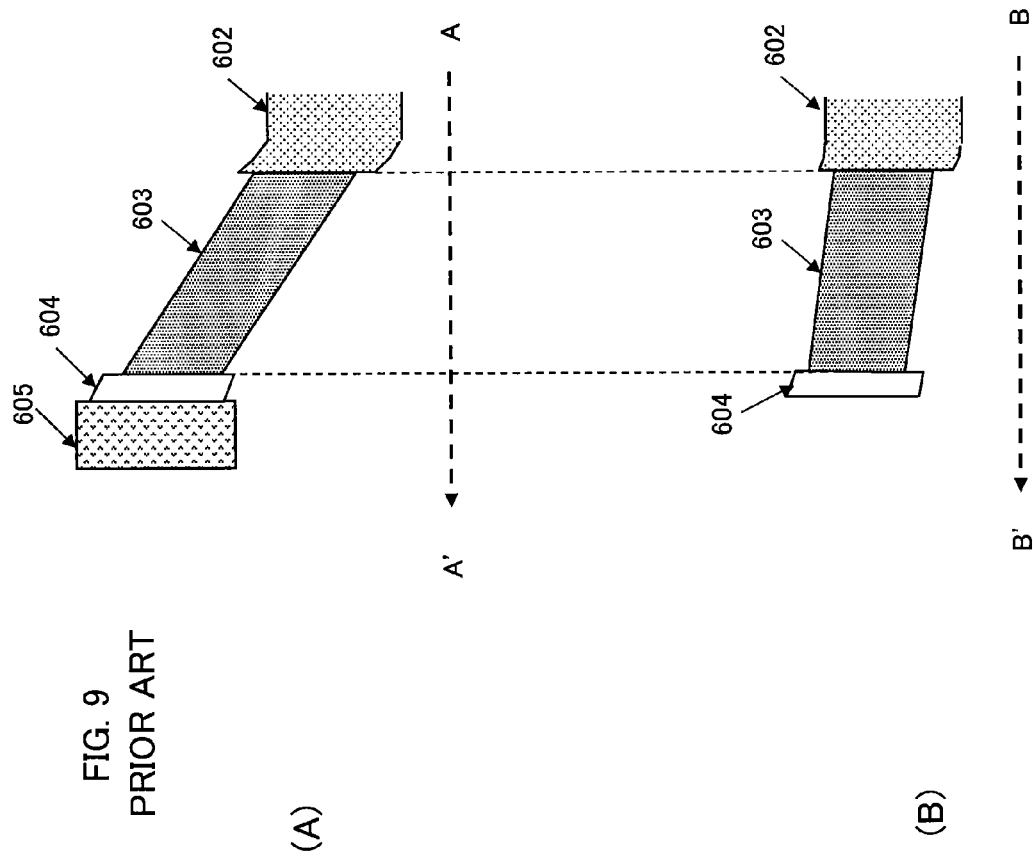
FIG. 9(A) is a band diagram in an A-A' cross section of FIG. 8.
FIG. 9(B) is a band diagram in a B-B' cross section of FIG. 8.

FIG. 5 is a view for explaining a semiconductor device 30 of the embodiment 3. The semiconductor device 30 is a ridge optical waveguide type of light modulator using an electroabsorption effect. FIG. 5 is a view schematically showing a cross section of the semiconductor device 30.

Reference numeral 301 is an InP substrate as a semi-insulating substrate, reference numeral 302 is an optical clad (described as an n-InP optical clad) serving as an n-electrode layer, reference numeral 303 is an optical confinement layer (described as a ud.-InGaAsP optical confinement layer), reference numeral 304 is a core layer (constituted of an InGaAs/InGaAlAs multiple quantum well) having the electroabsorption effect, reference numeral 305 is an optical confinement layer (described as a ud.-InGaAsP optical confinement layer), reference numeral 306 is an n-type InGaAsP electric field control layer (described as an n-InGaAsP electric field control layer, reference numeral 307 is a connection layer (described as a ud.-InGaAsP connection layer), reference numeral 308 is an optical clad (described as p-InP optical clad), reference numeral 309 is a p-type InGaAsP electrode layer (described as a p$^+$-InGaAsP electrode layer), reference numeral 310 is a p-electrode, and reference numeral 311 is an n-electrode.

In the semiconductor device 30, the core layer 304 and the ud.-InGaAsP optical confinement layer 305 constitute a first semiconductor layer, the p-InP optical clad 308 is a second semiconductor layer, the ud.-InGaAsP optical confinement layer 303 is a third semiconductor layer, and the ud.-InGaAsP connection layer 307 is a fourth semiconductor layer.

In the semiconductor device 30, although the polarity of pn is different from that of the semiconductor device 20 of the embodiment 2, the laminate arrangement of the layers is similar to that of the semiconductor device 20. In the semiconductor device 30, the ud.-InGaAs light-absorbing layer 204 and the p-InGaAsP electric field control layer 207 of the semiconductor device 20 are replaced with the core layer 304 and the p-InP optical clad 308 to function as an optical waveguide type of light modulator, respectively.

The conductivity types of the n-InP optical clad 302 to the p-InP optical clad 308 on the substrate side are $n_1$-i-$n_2$-i-p as in the semiconductor device 10 of the embodiment 1. Namely, a structure similar to that of the semiconductor device 10 is incorporated as a core layer and an optical confinement layer of a ridge optical waveguide type of light modulator.

An upper surface of the ud.-InGaAsP connection layer 307 has a portion where the p-InP optical clad 308 is disposed and an exposed portion where the p-InP optical clad 308 is not provided. A mesa of the exposed portion provided lower than the ud.-InGaAsP connection layer 307 has a laminate structure of $n_1$-i-$n_2$-i. Accordingly, in an operating state in which a reverse bias is applied to the device, a neutral region where electrons remain in the n-InGaAsP electric field control layer 306 is formed, and a voltage drop does not occur in the side surface of the core layer 304 exposed on the mesa side surface, or the voltage drop is reduced. Consequently, the occurrence of a leakage current attributable to the mesa side surface can be suppressed.

Effects of the Invention

The pn junction including InGaAs having a small bandgap is employed in various electronic devices and optical devices. However, when those devices are mesa type of devices for the purpose of high-speed operation, there is such a restriction that the size of the device is required to be increased to solve a problem that a leakage current is easily generated.

In this invention, the potential level difference (the fourth or fifth semiconductor layer) normally unrequired for the device operation is positively inserted in a device structure. The potential level difference has such a function that even if a semiconductor having a small bandgap is exposed on a mesa side surface, a potential drop amount of the portion is suppressed, and a leakage current inconvenient for device operation can be reduced. This effect can be commonly obtained for a heterostructure bipolar transistor, a photodiode, an electroabsorption modulator, and so on. In the photodiode, since the leakage current is alleviated, the device size can be reduced, so that in addition to improvement of operating speed with a reduction in series resistance, it is advantageous that the device can be densely disposed in an array.

Other Embodiments

In the embodiments 1 to 3, although the semiconductor device structure using InP, InGaAs, and InGaAsP as the semiconductor material of each layer has been described, the semiconductor material of each layer is not limited to above, and the present invention can be similarly applied to a device using other semiconductor materials.

REFERENCE SIGNS LIST 10, 20, 30 Semiconductor device
50: HBT
60: Photodiode
101: InP substrate
102: n-InP sub-collector layer
103: InGaAs collector layer
104: n-InGaAsP electric field control layer
105: InGaAsP intermediate layer
106: $p^+$-InGaAs base layer
107: n-InP emitter layer
108: Emitter electrode
109: Base electrode
110: Collector electrode
201: InP substrate
202: $p^+$-InGaAsP electrode layer
203: p-InGaAs light-absorbing layer
204: ud.-InGaAs light-absorbing layer
205: p-InGaAsP electric field control layer
206: ud.-InGaAsP intermediate layer
207: n-InGaAsP electric field control layer
208: n-InGaAsP electron transit layer
209: $n^+$-InGaAsP electrode layer
210: Dielectric antireflection film
211: n-electrode
212: p-electrode
301: InP substrate
302: n-InP optical clad
303: ud.-InGaAsP optical confinement layer
304: Core layer
305: ud.-InGaAsP optical confinement layer
306: n-InGaAsP electric field control layer
307: ud.-InGaAsP connection layer
308: p-InP optical clad
309: $p^+$-InGaAsP electrode layer
310: p-electrode
311: n-electrode
501: Semi-insulating InP substrate
502: InP sub-collector layer
503: n-type InGaAs collector layer
506: p-type InGaAs base layer
507: n-type InP emitter layer
508: Emitter electrode
509: Base electrode
510: Collector electrode
601: Semi-insulating InP
602: n-type InP contact layer
603: InGaAs light-absorbing layer
604: InGaAsP surface cover layer
605: p-type InP contact layer
606: p-electrode
607: n-electrode

What is claimed is:

1. A semiconductor device comprising a laminate structure comprising a first semiconductor layer provided on one side of a substrate in parallel with a surface of the substrate surface, a p-type second semiconductor layer, an n-type third semiconductor layer, and at least one of an n-type fourth semiconductor layer and a p-type fifth semiconductor layer, wherein the first semiconductor layer is disposed between the second semiconductor layer and the third semiconductor layer and has an impurity concentration lower than the impurity concentrations of the second and third semiconductor layers, the fourth semiconductor layer is disposed between the first semiconductor layer and the second semiconductor layer and has a bandgap larger than that of the first semiconductor layer, the fifth semiconductor layer is disposed between the first semiconductor layer and the third semiconductor layer and has a bandgap larger than that of the first semiconductor layer, when the second semiconductor layer is far from the substrate relative to the third semiconductor layer, the fourth semiconductor layer is essential, the outer circumference of the second semiconductor layer is more inward than the outer circumference of the fourth semiconductor layer, when the third semiconductor layer is far from the substrate relative to the second semiconductor layer, the fifth semiconductor layer is essential, and the outer circumference of the third semiconductor layer is more inward than the outer circumference of the fifth semiconductor layer.

2. The semiconductor device according to claim 1, wherein in a case where the second semiconductor layer is far from the substrate relative to the third semiconductor layer,
when a reverse bias is applied to between the second semiconductor layer and the fourth semiconductor layer, a potential difference of not less than 0.2 V and not more than 1.0 V is generated in the fourth semiconductor layer.

3. The semiconductor device according to claim 2, further comprising an n-type sixth semiconductor layer adjacent to the opposite side of the fourth semiconductor layer of the second semiconductor layer when the second semiconductor layer is far from the substrate relative to the third semiconductor layer.

4. The semiconductor device according to claim 1, wherein in a case where the third semiconductor layer is far from the substrate relative to the second semiconductor layer, when a reverse bias is applied to between the third semiconductor layer and the fifth semiconductor layer, a potential difference of not less than 0.2 V and not more than 1.0 V is generated in the fifth semiconductor layer.

5. The semiconductor device according to claim 4, further comprising a p-type seventh semiconductor layer adjacent to the opposite side of the fifth semiconductor layer of the third semiconductor layer when the third semiconductor layer is far from the substrate relative to the second semiconductor layer.

6. The semiconductor device according to claim 1, further comprising an n-type sixth semiconductor layer adjacent to the opposite side of the fourth semiconductor layer of the second semiconductor layer when the second semiconductor layer is far from the substrate relative to the third semiconductor layer.

7. The semiconductor device according to claim 1 further comprising a p-type seventh semiconductor layer adjacent to the opposite side of the fifth semiconductor layer of the third semiconductor layer when the third semiconductor layer is far from the substrate relative to the second semiconductor layer.

* * * * *